US007921803B2

(12) United States Patent
Yudovsky et al.

(10) Patent No.: US 7,921,803 B2
(45) Date of Patent: Apr. 12, 2011

(54) CHAMBER COMPONENTS WITH INCREASED PYROMETRY VISIBILITY

(75) Inventors: Joseph Yudovsky, Campbell, CA (US); Brendan McDougall, Livermore, CA (US); Ravi Jallepally, Santa Clara, CA (US); Yi-Chiau Huang, Fremont, CA (US); Maitreyee Mahajani, Saratoga, CA (US); Kevin Griffin, Livermore, CA (US); Andrew C. Sherman, Byron, CA (US)

(73) Assignee: Applied Materials, Inc., Santa Clara, CA (US)

( * ) Notice: Subject to any disclaimer, the term of this patent is extended or adjusted under 35 U.S.C. 154(b) by 829 days.

(21) Appl. No.: 11/859,080

(22) Filed: Sep. 21, 2007

(65) Prior Publication Data

US 2009/0078198 A1 Mar. 26, 2009

(51) Int. Cl.
*B05C 11/00* (2006.01)
(52) U.S. Cl. ............ 118/712; 702/30; 702/87; 702/130
(58) Field of Classification Search ............... 702/30, 702/87, 130
See application file for complete search history.

(56) References Cited

U.S. PATENT DOCUMENTS

| | | | | |
|---|---|---|---|---|
| 3,549,847 | A * | 12/1970 | Brown et al. | 219/634 |
| 4,611,930 | A * | 9/1986 | Stein | 374/126 |
| 4,891,499 | A | 1/1990 | Moslehi | |
| 4,984,902 | A | 1/1991 | Crowley et al. | |
| 5,308,161 | A * | 5/1994 | Stein | 374/5 |
| 6,228,174 | B1 * | 5/2001 | Takahashi | 118/725 |
| 6,280,183 | B1 * | 8/2001 | Mayur et al. | 432/258 |
| 6,753,506 | B2 * | 6/2004 | Liu et al. | 219/390 |
| 7,023,229 | B2 | 4/2006 | Maesaki et al. | |
| 2003/0036877 | A1 * | 2/2003 | Schietinger | 702/134 |
| 2003/0049372 | A1 * | 3/2003 | Cook et al. | 427/248.1 |
| 2004/0058155 | A1 * | 3/2004 | Windischmann | 428/408 |
| 2005/0102108 | A1 * | 5/2005 | Ramachandran et al. | 702/30 |
| 2007/0084406 | A1 | 4/2007 | Yudovsky et al. | |
| 2008/0035632 | A1 * | 2/2008 | Fujita et al. | 219/634 |

OTHER PUBLICATIONS

Bourdo, S. E., Viswanathan T., Carbon 43 (2005) 2983-2988.*
Modine, F. A., et al, Phys. Rev. B. 1984, 29, 836-841.*
Song, M-K; Rhee, S-W; Chemical Vapor Deposition 2008, 14, 334-338.*
Jasper, "Novel Uses of a Silicon Carbide Susceptor for Rapid Thermal Processor." Motorola Technical Developments, vol. 23, Oct. 1994, pp. 129-133.

* cited by examiner

*Primary Examiner* — Parviz Hassanzadeh
*Assistant Examiner* — Albert Hilton
(74) *Attorney, Agent, or Firm* — Patterson & Sheridan, LLP

(57) ABSTRACT

The present invention generally provides method and apparatus for non-contact temperature measurement in a semiconductor processing chamber. Particularly, the present invention provides methods and apparatus for non-contact temperature measurement for temperature below 500° C. One embodiment of the present invention provides an apparatus for processing semiconductor substrates. The apparatus comprises a target component comprises a material with higher emissivity than the one or more substrates.

10 Claims, 4 Drawing Sheets

```
┌─────────────────────────────────────────────────────────┐
│ POSITION DEVICE PROXIMAL TO ORIGIN CALLER               │
└────────────────────────┬────────────────────────────────┘
                         │
┌────────────────────────┴────────────────────────────────┐
│ FIND ACCEPTABLE INTENSITY LEVEL OF SOUND                │
└────────────────────────┬────────────────────────────────┘
                         │
┌────────────────────────┴────────────────────────────────┐
│ ADJUST POTENTIOMETER TO MINIMAL ACCEPTABLE INTENSITY LEVEL │
└────────────────────────┬────────────────────────────────┘
                         │
┌────────────────────────┴────────────────────────────────┐
│ CONTINUE SPEECH AT INTENSITY INDICATED BY SIGNAL LIGHT  │
└─────────────────────────────────────────────────────────┘
```

FIG. 2

CHAMBER COMPONENTS WITH INCREASED PYROMETRY VISIBILITY

BACKGROUND OF THE INVENTION

1. Field of the Invention

Embodiments of the present invention generally relate to apparatus and method for monitoring and controlling temperature of semiconductor substrates during processing. More particularly, embodiments of the present invention relates to processing chamber with components having increased pyrometry visibility at low temperatures.

2. Description of the Related Art

Shrinking feature size in semiconductor devices greatly increases the need for precise processing. One factor for precise processing is uniformity, including uniformity within a substrate and among substrates. It is critical to expose a substrate or a batch of substrates to a processing environment at a uniform temperature during processing. Therefore, there is increased need to improve temperature uniformity in semiconductor processing.

At the same time, the need for effectiveness also increases as the manufacturers adjusting to the increased competition. Batch substrate processing, rather than single substrate processing, is one of the trend to achieve higher effectiveness as batch processing increases throughput. A batch processing chamber, used in a batch processing, is generally configured to house a plurality of substrates in a processing volume and process the plurality of substrates simultaneously. The plurality of substrates are generally stacked or other wise arranged with a device side exposed to a processing environment within the processing volume. Each of the plurality of substrates is exposed to a different region of the processing volume. Achieving uniformity within a batch processing chamber is a critical and usually difficult task for the manufacturers.

Many batched processes, such as for example thermal annealing, chemical vapor deposition, and atomic layer deposition, are very sensitive to temperature. Temperature uniformity is necessity within a batch of substrates, among batches, as well as across a surface of a single substrate.

Temperature uniformity is usually achieved by measuring temperatures in various locations in a batch chamber, and controlling the temperature according to measurements. Non-contact temperature measuring methods, such as pyrometry, are convenient and effective way to measure temperature of substrates or chamber components in a semiconductor processing chamber since semiconductor processes are usually performed in a controlled environment and temperature may be measured without the processing environment being contaminated, damaged or interfered.

However, pyrometry integrated in the state of the art processing chambers has difficulties measuring temperature below 500° C. because substrates and/or chamber components do not emit sufficient infrared energy to be seen by pyrometers at temperatures below 500° C.

Therefore, there is a need for apparatus and method for non-contact temperature measurement in wider temperature range.

SUMMARY OF THE INVENTION

Embodiments of the present invention generally provides method and apparatus for non-contact temperature measurement in a semiconductor processing chamber. Particularly, the present invention provides methods and apparatus for non-contact temperature measurement for temperature below 500° C.

One embodiment provides an apparatus for processing semiconductor substrates comprising a chamber body defining a processing volume therein, one or more sensors disposed outside the processing volume, and a target component disposed in the processing volume, wherein the target component comprises a material with higher emissivity than the one or more substrates, the one or more sensors are configured to sense an attribute indicative of temperature of the target component.

Another embodiment provides an apparatus for processing a plurality of substrates comprising, a chamber body defining a processing volume therein, one or more heater disposed outside the quartz chamber body and configured to heat the chamber body, a substrate support assembly configured to transport and support the plurality of substrates to and from the processing volume, and a plurality of temperature sensors disposed outside the processing volume, wherein at least one of the chamber body and the substrate support assembly comprises a material with higher emissivity than the plurality of substrates, the plurality of temperature sensors are configured to sense an attribute indicative of temperature of one of the chamber body and the substrate support assembly.

Yet another embodiment provides a method for processing one or more semiconductor substrates comprising positioning the one or more substrates in a processing volume defined by a chamber body of a processing chamber, heating the processing chamber using one or more heaters, and obtaining an attribute indicative of temperature of the one or more substrates by measuring a component of the processing chamber using one or more sensors disposed outside the chamber body, wherein the component comprises a material with higher emissivity than the one or more substrates.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present invention generally provides method and apparatus for measuring temperature of substrates during processing. Embodiments of the present invention include a batch processing chamber comprising chamber component with higher emissivity than the substrate being processed. Temperatures in the chamber may be measured using a non-contact sensor, such as a pyrometer, to measure the camber components with high emissivity. High emissivity of the components enables the temperature measurement to be accurate at temperatures below about 500° C. and above about 100° C. In one embodiment, the chamber component may be arranged close to the substrate/substrates being processed so that temperature of the substrate/substrates may be evaluated by measuring the chamber components with high emissivity.

It should be noted that even though measuring of low temperature is emphasized in the description below, embodiments of the present invention are inherently capable of measuring high temperature, such as temperatures above 500° C., because sufficient infrared energy is emitted by chamber components and substrates at such temperatures for optical sensors to render accurate measurement.

Figure 1:
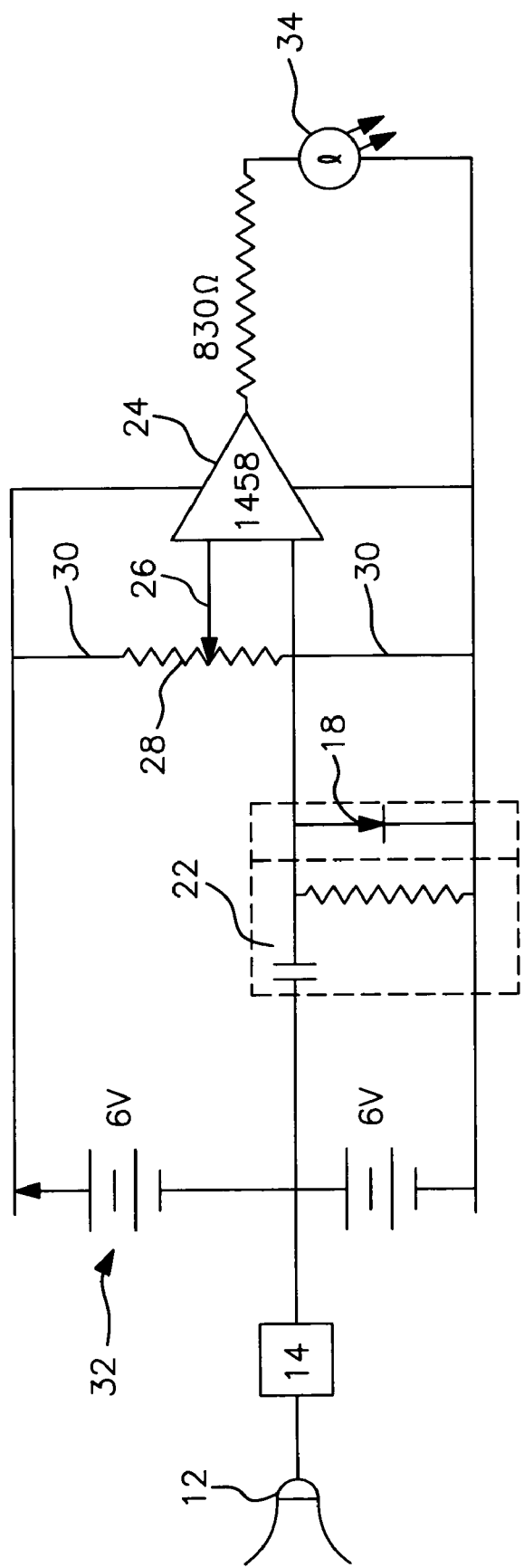
FIG. 1 schematically illustrates a sectional side view of a batch processing chamber in accordance with one embodiment of the present invention.
Figure 2:
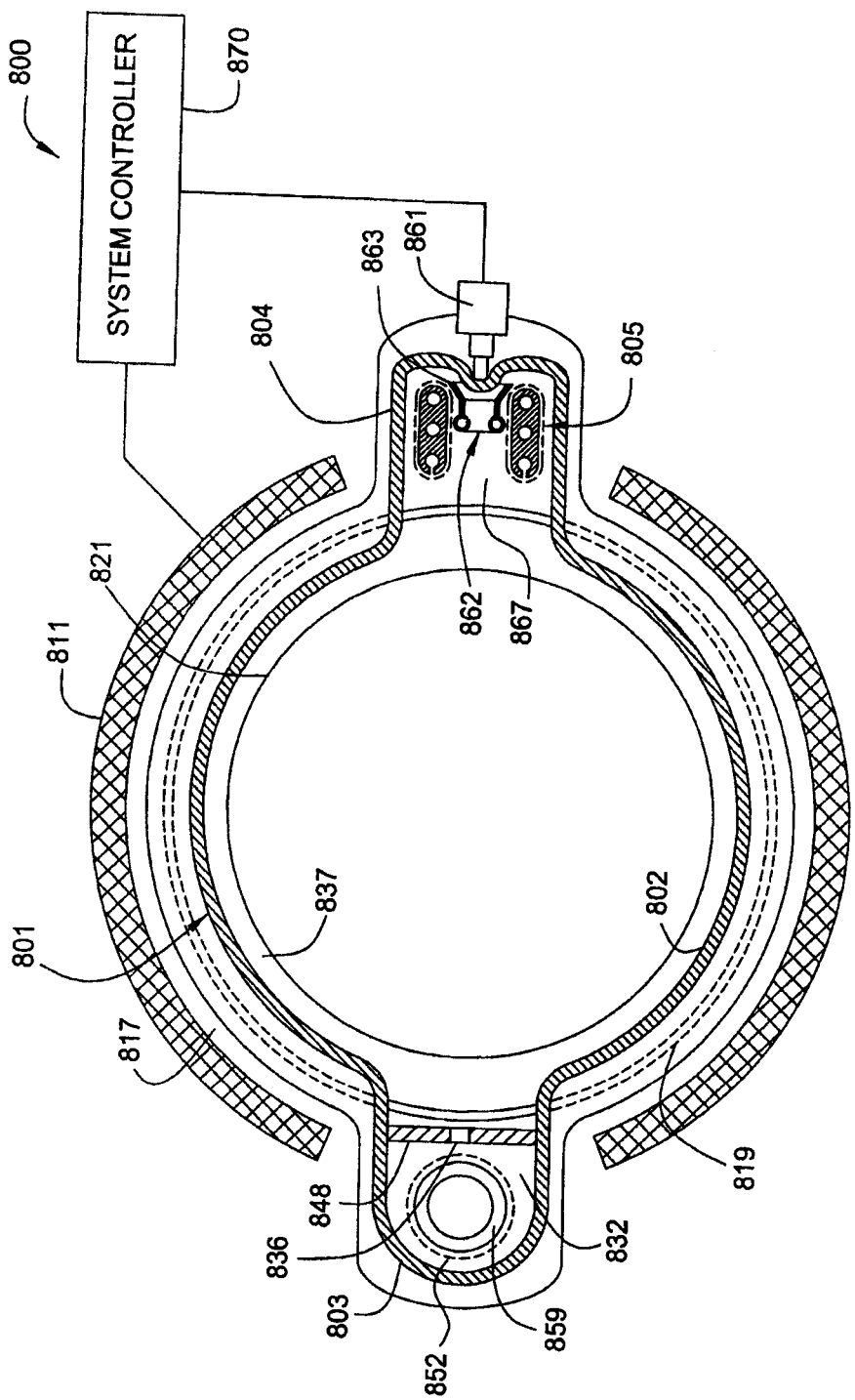
FIG. 2 schematically illustrates a sectional top view of the batch processing chamber of FIG. 1.

FIGS. 1-2 illustrate a batch processing chamber 800 in accordance with one embodiment of the present invention. FIG. 1 illustrates a sectional side view of the batch processing chamber 800. FIG. 2 illustrates a top view of the batch processing chamber 800. The batch processing chamber 800 comprises non-contact temperature sensors configured to monitor temperature inside the batch processing chamber 800.

The batch processing chamber 800 comprises a quartz chamber 801 surrounded by a heater 811, shown in FIG. 2. The quartz chamber 801 comprises a cylindrical chamber body 802, an exhaust pocket 803 formed on one side of the chamber body 802, and an inject pocket 804 formed opposing the exhaust pocket 803. The chamber body 802 defines a processing volume 837 which is configured to accommodate a plurality of substrates 821 during processing.

The quartz chamber 801 has an opening 818 at bottom and has a flange 817 around the bottom. The flange 817 may be welded on and is configured to be in intimate contact with a support plate 810. In one embodiment, both the exhaust pocket 803 and the inject pocket 804 are open at the bottom of the quartz chamber 801. In one embodiment, the flange 817 may be a quartz plate having an exhaust opening 851, a center opening 818, and two inject openings 860.

The exhaust opening 851 is configured for an exhaust conduit 859 to be inserted into the exhaust pocket 803. The center opening 818 is configured for a substrate support assembly 814 to transfer the plurality of substrates 821 to and from the processing volume 837. The inject openings 860 are configured for the inject assemblies 805 to be inserted into the inject pocket 804.

Accordingly, the support plate 810 has openings 850, 839, and 816 aligned with the exhaust opening 851, the center opening 818, and the inject openings 860 respectively. O-ring seals 852, 819, and 856 are disposed between the support plate 810 and the flange 817 around the openings 850, 839, and 816.

When the exhaust conduit 859 is assembled, a second O-ring 858 is disposed around the opening 850 underneath the support plate 810. This double O-ring sealing configuration allows the exhaust conduit 859 to be removed and serviced without affecting the rest of the batch processing chamber 800. The same sealing configuration may be arranged around the inject assemblies 805. O-rings 857 are disposed around the openings 816 for vacuum sealing of the inject assemblies 805.

An exhaust block 848 is disposed between the chamber body 802 and the exhaust pocket 803. An exhaust volume 832 is defined by the exhaust pocket 803 and the exhaust block 848. An exhaust conduit 859 in fluid communication with a pumping device is disposed in the exhaust volume 832.

The exhaust volume 832 is in fluid communication pumping devices through a single exhaust port hole 833 near the bottom of the exhaust volume 832. The exhaust volume 832 is in fluid communication with the processing volume 837 via a plurality of connecting conduits 836 formed in the exhaust block 848. To generate an even draw from top to bottom of the exhaust volume 832, the size of the connecting conduits 836 may vary from bottom to top.

In one embodiment, the batch processing chamber 800 comprises two inject assemblies 805 disposed in the inject pocket 804. The two inject assemblies 805 are positioned side by side leaving an open corridor 867 between them. In one aspect, each inject assembly 805 may be configured to supply the processing volume 837 with processing gases independently.

A vertical channel 824 is formed inside the inject assembly 805 and is configured to be in fluid communication with sources of processing gases. A plurality of evenly distributed horizontal holes 825 are drilled in the vertical channel 824 forming a vertical shower head. The horizontal holes 825 are directed to the processing volume 837 such that processing gases flown in from the vertical channel 824 may be evenly disbursed up and down the processing volume 837.

Vertical cooling channels 827 are formed inside the inject assembly 805 providing means to control the temperature of the inject assembly 805. In one aspect, two of the vertical cooling channels 827 may be milled from the bottom of the inject assembly 805 in a small angle such that they meet at the top. Therefore, a heat exchanging fluid may be flown in from one of the cooling channels 827 and flown out from the other cooling channel 827. In one aspect, the two inject assemblies 805 may be temperature controlled independently from one another according to the process requirement.

Detailed description of similar batch processing chambers may be found in the U.S. patent application Ser. No. 11/249,555, entitled "Reaction Chamber with Opposing Pockets for Gas Injection and Exhaust", which is incorporated herein by reference.

In one embodiment, the inject pocket 804 having a plurality of dimples 863 in which a plurality of sensors 861 are disposed. The sensors 861 are configured to measure temperatures of the plurality of substrates 821 inside the quartz chamber 801 during processing. The plurality of sensors 861 are non-contact temperature sensors configured to measure temperature in the processing volume 837, for example near the plurality of substrates 821, from a location outside the quartz chamber 801. The plurality of sensors 861 enable monitoring temperature within the quartz chamber 801 without contamination, damage, or interference to the processing.

In one embodiment, the plurality of sensors 861 are optical pyrometers which can determine the temperature of a body by sampling and analyzing radiation energy emitted by the body, including infrared, visible light, x-rays, and radio waves.

Emissivity, which indicates the ability of an object to emit or absorb energy, of the object being measured usually affects the temperature range of an optical pyrometer. Emissivity of an object is a ratio of energy emitted by the object and energy emitted by a perfect emitter at the same temperature. A perfect emitter, also called a black body, has an emissivity of 1 emitting 100% of incident energy. An object with emissivity of 0.8 will absorb 80% and reflect 20% of the incident energy. Emissivity varies with temperature and wavelength. Optical pyrometers will encounter difficulties measuring temperature of objects with low emissivity. An optical pyrometer measuring infrared emission usually only measures temperature of semiconductor substrates at a range of over 500° C. because emissivity of semiconductor substrates is too low at infrared wavelength for pyrometer to provide accurate measurement under 500° C.

Embodiments of the present invention provide a processing chamber with one or more target components comprising a material of high emissivity at low temperatures, i.e. below about 500° C. and above about 75° C. Thus, low temperature within the processing chamber may be obtained using an optical pyrometer to measure the one or more target components. In one embodiment, the one or more target components may be disposed near a plurality of substrates being processed so that the temperature of the one or more target components corresponding to temperature of the plurality of substrates. In one embodiment, the one or more target components are formed by a material with high emissivity at low temperature. In another embodiment, the one or more target components may be coated with a material with high emissivity at low temperature, for example as low as 75° C. The thickness of the coating dependents on adsorption coefficient of the high emissivity material. In one embodiment, embodiments of the present invention provide a processing chamber comprises target components that enable measuring temperature using optical pyrometers at a range above about 75° C. Particularly, embodiments of the present invention may comprise target components that enable temperature measurement using optical pyrometry at an accuracy of about 1.5° C. in a range above about 100° C.

In one embodiment, the one or more target components comprise one of a substrate support assembly, and a chamber body. Suitable high emissivity material includes any materials having a surface morphology that provides adequate trapping of incident radiation, for example silicon carbide (SiC), graphite, and any material that has a high emissivity in infrared spectrum and does not break down or react during normal chamber operation at low temperature, i.e. below 500° C., or as low as 75° C. In one embodiment, the one or more target components may have a coating of a high emissivity material, for example silicon carbide, and graphite. In another embodiment, a protective film may be coated over the high emissivity material to reduce contamination in the processing chamber.

Referring back to FIGS. 1 and 2, the plurality of sensors 861 are configured to obtain an attribute of a component of the batch processing chamber 800, wherein the attribute is indicative of temperature of the plurality of substrates. The component being measured comprises a material having a higher emissivity than the plurality of substrates 821 therefore may be measured by the plurality of sensors 861.

In one embodiment, the substrate support assembly 814 may be formed by a high material with high emissivity, such as silicon carbide and the plurality of sensors 861 are configured to measure infrared emission of the substrate support assembly. In another embodiment, at least a portion of the substrate support assembly 814 may be coated with a material having high emissivity at low temperatures, i.e. under 500° C., such as graphite, or silicon carbide. In one embodiment, at least a portion of the substrate support assembly 814 may have a coating of a high emissivity material. The thickness of the coating dependents on adsorption coefficient of the high emissivity material. In one embodiment, the coating comprises a graphite film with a thickness greater than 0.1 mm. In another embodiment, a protective film may be coated over the high emissivity material to reduce contamination in the processing chamber.

In another embodiment, at least a portion of the quartz chamber 801 is coated with a material having high emissivity, wherein the plurality of sensors 861 are configured to measure emissivity of the portion of the quartz chamber 801 coated with the material having high emissivity. In one embodiment, a target film is deposited on at least a portion of the quartz chamber 801, wherein the target film is configured to be measured by the plurality of sensors 861 in obtaining chamber temperature. In one embodiment, the target film comprises graphite and may be deposited by chemical vapor deposition or atomic layer deposition. In another embodiment, the target film comprises tantalum doped graphite. In one embodiment, the target film may be a coating of graphite with a thickness greater than 0.1 mm. In another embodiment, a protective film may be coated over the target film to reduce contamination in the processing chamber.

In one embodiment, the plurality of sensors 861 obtain the attribute by "looking" through the transparent quartz chamber 801 through the open corridor 867 between the inject assemblies 805.

The sensors 861 may be further connected to a system controller 870. In one embodiment, the system controller 870 is able to monitor and analyze temperatures of the substrates 821 being processed. In another embodiment, the system controller 870 may send control signals to the heater 811 according to measurements from the plurality of sensors 861. In yet another embodiment, the heater 811 may comprise several controllable zones such that the system controller 870 is able to control the heater 811 by region and adjust heating characteristics locally.

During some processes, especially deposition processes, the chemical gases used in the process may deposit and/or condense on the quartz chamber 801. Deposition and condensation near the dimples 863 can blur "visions" of the sensors 861 and reduce accuracy of the sensors 861. In one embodiment, a cleaning assembly 862 is positioned inside the inject pocket 804. The cleaning assembly 862 blows a purge gas to inner surfaces of the dimples 863 so that areas near the dimples 863 are not exposed to the chemical gases used in the process. Therefore, keeping undesired deposition and condensation from happening.

Figure 3:
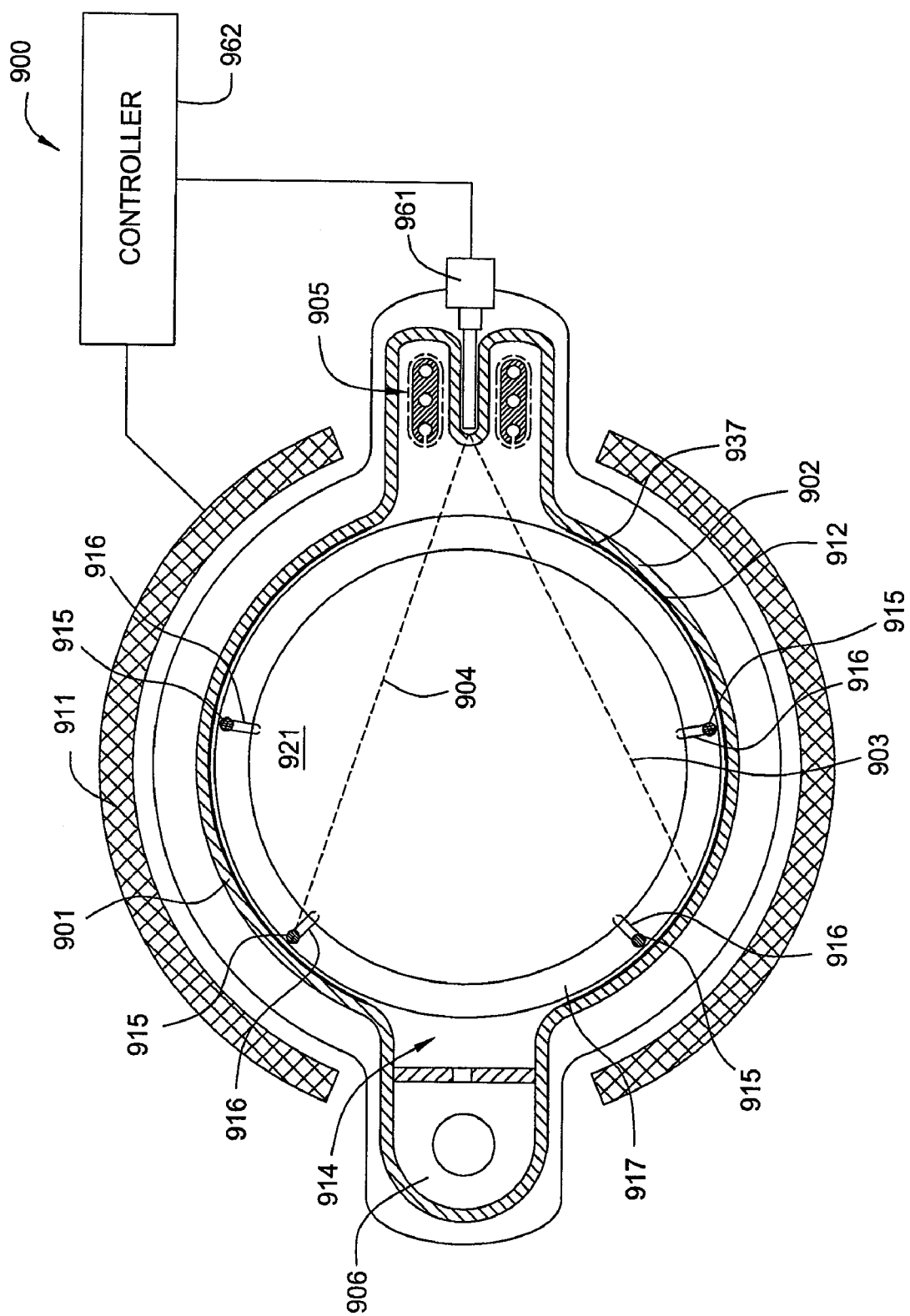
FIG. 3 schematically illustrates a sectional top view of a batch processing chamber in accordance with one embodiment of the present invention.

FIG. 3 schematically illustrates a sectional top view of a batch processing chamber 900 having target components for measuring temperatures below 500° C. and above about 75° C. In one embodiment, the batch processing chamber 900 comprises target components that enable measuring temperature using optical pyrometry at a range above 75° C. Particularly, the batch processing chamber 900 may comprise target components that enable temperature measurement using optical pyrometry at an accuracy of about 1.5° C.

The batch processing chamber 900 comprises a quartz chamber 901 surrounded by a heater 911. The quartz chamber 801 comprises a cylindrical chamber body 902, an exhaust pocket 906 on one side of the chamber body 902, and an inject assembly 905 disposed opposing the exhaust pocket 906. At least one pyrometer 961 is positioned outside the quartz chamber 901 and is configured to measure temperature inside the quartz chamber 901.

Figure 4:
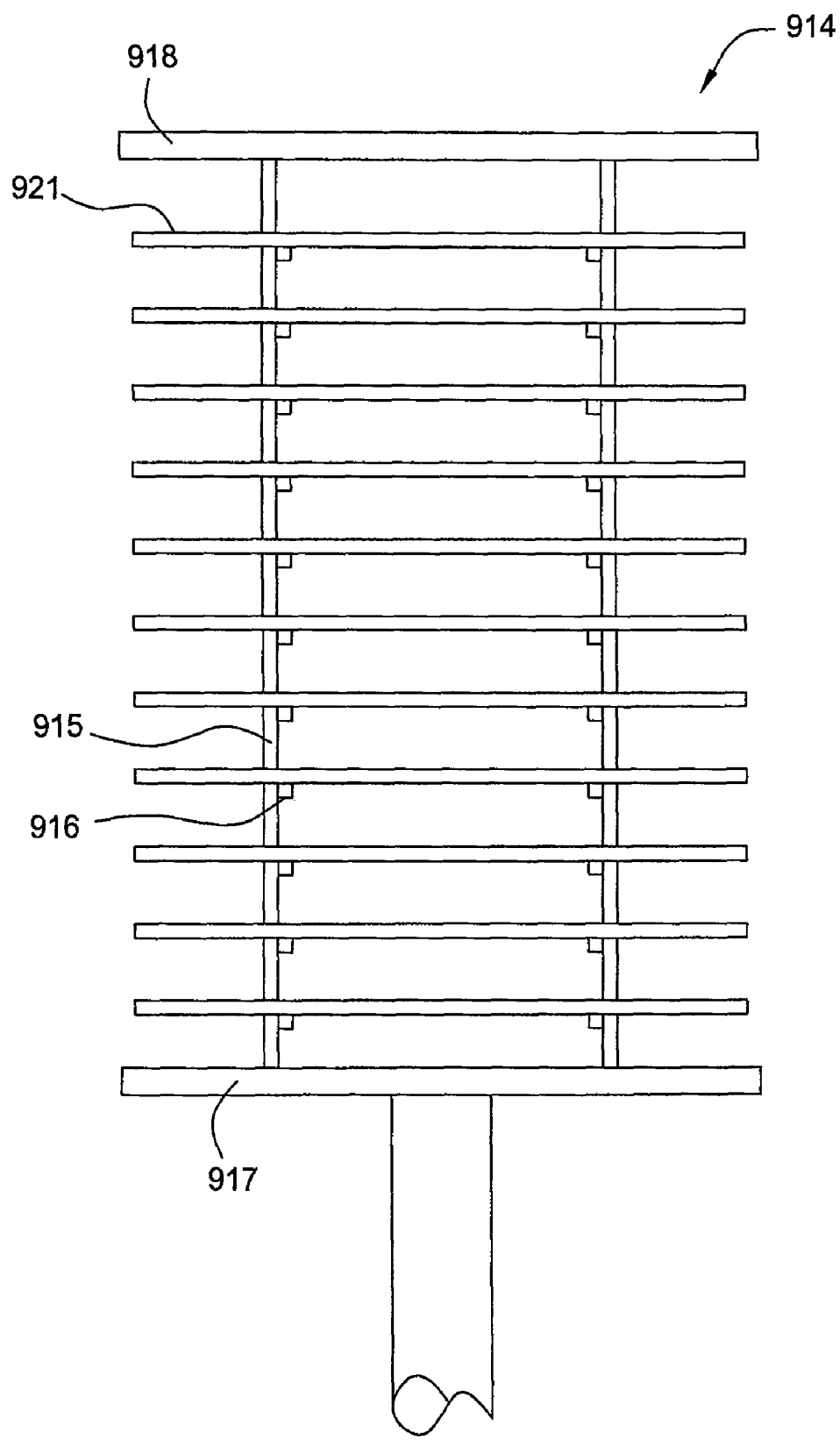
FIG. 4 schematically illustrates a side view of a substrate support assembly of the batch processing chamber of FIG. 3.
Figure 1:
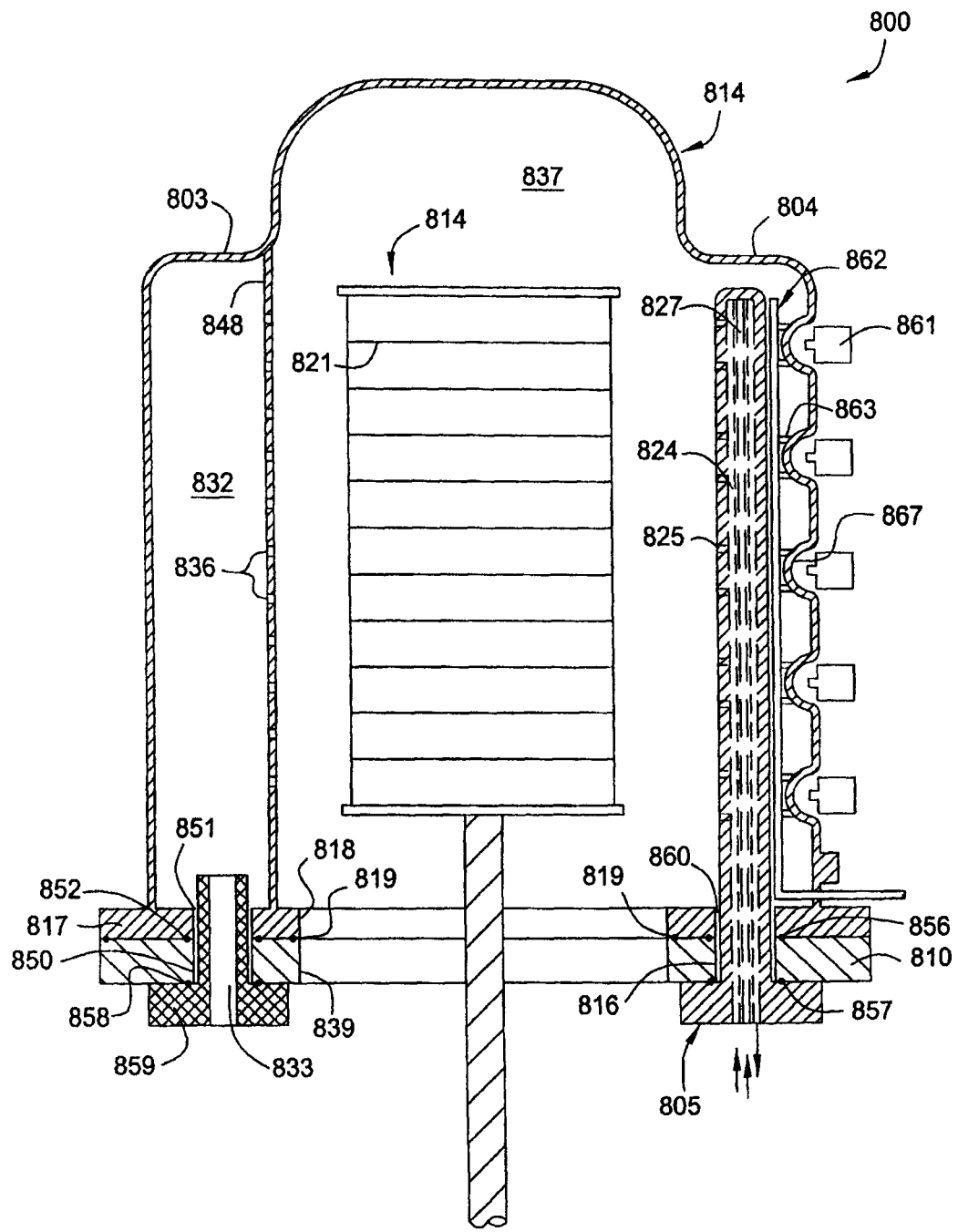

The chamber body 902 defines a process volume 937 which is configured to accommodate a plurality of substrates 921 during processing. The plurality of substrates 921 are supported by a substrate support assembly 914 configured to support and transport a plurality of substrates. FIG. 4 schematically illustrates a side view of the substrate support assembly 914. The substrate assembly 914 comprises a bottom plate 917 and three or more supporting posts 915 extended from the bottom plate 917. The three or more supporting posts 915 may further connect to a top plate 918 for a robust structure. A plurality of supporting fingers 916 extend from each of the three or more supporting posts 915, and provide a plurality of substrate receiving surfaces each configured to receive a substrate 921.

In one embodiment, at least a portion of the substrate assembly 914 is formed by or coated with a material having high emissivity at temperature below 500° C., for example silicon carbide. As shown by line 904 of FIG. 3, the pyrometer 961 is configured to receive infrared emission from the supporting post 915, which is made of or coated with material of high emissivity, thus measuring temperature near the substrate 921. By including high emissivity material in the substrate support assembly 914, low temperature, i.e. below 500° C., may be measured using the convenience of the pyrometer 961, which is otherwise only used to measure temperature higher than 500° C. Compared to traditional low temperature measurement, such as using thermal couples, methods of the present invention provide convenience, lowered cost and higher processing quality from less contamination and interference.

In another embodiment, inner surface and/or outer surface of the quartz chamber 901 coated with infrared opaque material, such as a carbon polymer film. The coating of infrared opaque material allows the quartz chamber 901 to function as a blackbody cavity. As shown in FIG. 3, a target film 912 is deposited on an inner side of the quartz chamber 901. The target film 912 comprises materials of high emissivity at low temperature and is configured to be a measuring target for the pyrometer 961. As shown by line 903, the pyrometer 961 may be configured to receive infrared emission from the target film 912. In one embodiment, the target film 912 may be a carbon polymer film. The target film 912 may be formed by chemical vapor deposition or atomic layer deposition.

In addition to assisting low temperature measurement, the target film 912 may provide other benefit to the batch processing chamber 900. In one embodiment, the target film 912 may be a conductive colloid film. In one embodiment, the target film 912 may be graphite doped with tantalum, which changes electrical resistive of the target film 912. The conductivity of the target film 912 allows charge to distribute uniformly across the quartz chamber 901 and reduces local concentration of charges, thus diminishing the possibility of electrical breakdown in a reduced pressure environment, especially when the quartz chamber 901 is heated by an electrical heater.

When the batch processing chamber 900 is configured to perform a process that is sensitive to carbon contamination, a target film similar to the target film 912 may be deposited on an outer surface of the quartz chamber 901 to assist low temperature measurement by the pyrometer 961.

In another embodiment, a closed loop temperature control may be achieved using a controller 962, which adjusts the heater 911 according to measurements from the pyrometer 961.

In another embodiment, a calibration step may be run prior to processing and/or periodically to correlate temperature between the measurement of by the pyrometer 961 and the actual substrate temperature to increase precision.

Even though a batch processing chamber is described in accordance with the present invention, embodiments of the present invention may be used in any suitable chambers where a non-contact temperature measurement of a low temperature environment, i.e. below 500° C., is desired.

While the foregoing is directed to embodiments of the present invention, other and further embodiments of the invention may be devised without departing from the basic scope thereof, and the scope thereof is determined by the claims that follow.

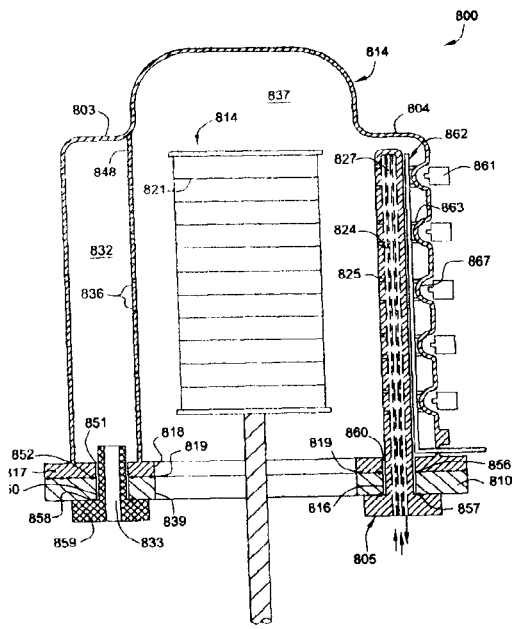

What is claimed is:

1. An apparatus for processing semiconductor substrates, comprising:
   a chamber body defining a processing volume therein; one or more sensors disposed outside the processing volume; and a target film deposited on a surface of the chamber body, wherein the target film comprises tantalum doped graphite having an emissivity in infrared spectrum at a temperature below 500° C., and the one or more sensors are configured to sense an attribute indicative of temperature of the target film.

2. The apparatus of claim 1, further comprising a substrate support assembly selectively disposed in the processing volume and configured to support one or more substrates therein, wherein at least a portion of the substrate support assembly has a coating comprising silicon carbide.

3. The apparatus of claim 1, wherein the chamber body is made of quartz.

4. The apparatus of claim 3, wherein the target film is deposited on an inner surface of the chamber body.

5. The apparatus of claim 3, wherein the target film is deposited on an outer surface of the chamber body.

6. The apparatus of claim 1, further comprising:
   a heater disposed outside the chamber body and configured to heat the chamber body; and
   a controller configured to adjust the heater according to temperature measurement from the one or more sensors.

7. The apparatus of claim 1, wherein the one or more sensors are pyrometers configured to detect infrared emission from objects being measured.

8. An apparatus for processing a plurality of substrates, comprising:
   a quartz chamber body defining a processing volume therein; one or more heaters disposed outside the quartz chamber body and configured to heat the chamber body; a substrate support assembly configured to transport and support the plurality of substrates to and from the processing volume, wherein at least a portion of the substrate support assembly has a coating comprising silicon carbide which has an emissivity in infrared spectrum at a temperature below 500° C.; and
   a plurality of temperature sensors disposed outside the processing volume, wherein an inner and/or outer surfaces of the chamber body is coated with a layer comprising tantalum doped graphite, the plurality of temperature sensors are configured to sense an attribute indicative of temperature of one of the chamber body and the substrate support assembly.

9. The apparatus of claim 5, further comprising a controller coupled to the heater and the plurality of temperature sensors, wherein the controller is configured to perform a closed loop temperature control by adjusting the heater according to measurement from the plurality of temperature sensors.

10. The apparatus of claim 1, further comprising:
    a protective film coated over the target film.

* * * * *

UNITED STATES PATENT AND TRADEMARK OFFICE
CERTIFICATE OF CORRECTION

| | | |
|---|---|---|
| PATENT NO. | : 7,921,803 B2 | Page 1 of 4 |
| APPLICATION NO. | : 11/859080 | |
| DATED | : April 12, 2011 | |
| INVENTOR(S) | : Yudovsky et al. | |

It is certified that error appears in the above-identified patent and that said Letters Patent is hereby corrected as shown below:

Please delete the title page showing an illustrative figure and substitute therefor the attached title page Delete drawing sheet 1-2 and insert drawing sheet 1-2 consisting of figures 1-2 as attached Signed and Sealed this
Twenty-third Day of August, 2011

David J. Kappos
*Director of the United States Patent and Trademark Office*

(12) United States Patent
Yudovsky et al.

(10) Patent No.: US 7,921,803 B2
(45) Date of Patent: Apr. 12, 2011

(54) CHAMBER COMPONENTS WITH INCREASED PYROMETRY VISIBILITY

(75) Inventors: Joseph Yudovsky, Campbell, CA (US); Brendan McDougall, Livermore, CA (US); Ravi Jallepally, Santa Clara, CA (US); Yi-Chiau Huang, Fremont, CA (US); Maitreyee Mahajani, Saratoga, CA (US); Kevin Griffin, Livermore, CA (US); Andrew C. Sherman, Byron, CA (US)

(73) Assignee: Applied Materials, Inc., Santa Clara, CA (US)

( * ) Notice: Subject to any disclaimer, the term of this patent is extended or adjusted under 35 U.S.C. 154(b) by 829 days.

(21) Appl. No.: 11/859,080

(22) Filed: Sep. 21, 2007

(65) Prior Publication Data
US 2009/0078198 A1  Mar. 26, 2009

(51) Int. Cl.
B05C 11/00  (2006.01)
(52) U.S. Cl. ............ 118/712; 702/30; 702/87; 702/130
(58) Field of Classification Search .......... 702/30, 702/87, 130
See application file for complete search history.

(56) References Cited

U.S. PATENT DOCUMENTS

| | | | |
|---|---|---|---|
| 3,549,847 A * | 12/1970 | Brown et al. | 219/634 |
| 4,611,930 A * | 9/1986 | Stein | 374/126 |
| 4,891,499 A | 1/1990 | Moslehi | |
| 4,984,902 A | 1/1991 | Crowley et al. | |
| 5,308,161 A * | 5/1994 | Stein | 374/5 |
| 6,228,174 B1 * | 5/2001 | Takahashi | 118/725 |
| 6,280,183 B1 * | 8/2001 | Mayur et al. | 432/258 |
| 6,753,506 B2 * | 6/2004 | Liu et al. | 219/390 |
| 7,023,229 B2 | 4/2006 | Maesaki et al. | |
| 2003/0036877 A1 * | 2/2003 | Schietinger | 702/134 |
| 2003/0049372 A1 * | 3/2003 | Cook et al. | 427/248.1 |
| 2004/0058155 A1 * | 3/2004 | Windischmann | 428/408 |
| 2005/0102108 A1 * | 5/2005 | Ramachandran et al. | 702/30 |
| 2007/0084406 A1 | 4/2007 | Yudovsky et al. | |
| 2008/0035632 A1 * | 2/2008 | Fujita et al. | 219/634 |

OTHER PUBLICATIONS

Bourdo, S. E., Viswanathan T., Carbon 43 (2005) 2983-2988.*
Modine, F. A., et al. Phys. Rev B. 1984, 29, 836-841.*
Song, M-K; Rhee, S-W; Chemical Vapor Deposition 2008, 14, 334-338.*
Jasper, "Novel Uses of a Silicon Carbide Susceptor for Rapid Thermal Processor," Motorola Technical Developments, vol. 23, Oct. 1994, pp. 129-133.

* cited by examiner

Primary Examiner — Parviz Hassanzadeh
Assistant Examiner — Albert Hilton
(74) Attorney, Agent, or Firm — Patterson & Sheridan, LLP

(57) ABSTRACT

The present invention generally provides method and apparatus for non-contact temperature measurement in a semiconductor processing chamber. Particularly, the present invention provides methods and apparatus for non-contact temperature measurement for temperature below 500° C. One embodiment of the present invention provides an apparatus for processing semiconductor substrates. The apparatus comprises a target component comprises a material with higher emissivity than the one or more substrates.

10 Claims, 4 Drawing Sheets